United States Patent [19]
McCullough et al.

[11] Patent Number: 5,973,764
[45] Date of Patent: *Oct. 26, 1999

[54] VACUUM ASSISTED DEBRIS REMOVAL SYSTEM

[75] Inventors: Andrew W. McCullough, Newtown; Sean Olson, Fairfield, both of Conn.

[73] Assignee: SVG Lithography Systems, Inc., Wilton, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/878,633

[22] Filed: Jun. 19, 1997

[51] Int. Cl.$^6$ ........................................... G01J 1/00
[52] U.S. Cl. ................................................ 355/30
[58] Field of Search ................................. 355/30, 73, 76; 250/441.11

[56] References Cited

U.S. PATENT DOCUMENTS

| | | | |
|---|---|---|---|
| 4,607,167 | 8/1986 | Petrie | 250/441.1 |
| 4,752,668 | 6/1988 | Rosenfeld et al. | 219/121 LH |
| 4,818,838 | 4/1989 | Young et al. | 250/441.1 |
| 4,837,443 | 6/1989 | Young et al. | 250/441.1 |
| 5,359,176 | 10/1994 | Balliet, Jr. et al. | 219/121.84 |
| 5,508,528 | 4/1996 | Mulkens et al. | |

*Primary Examiner*—Safet Metjahic
*Assistant Examiner*—Michael Dalakis
*Attorney, Agent, or Firm*—Fattibene & Fattibene; Paul A. Fattibene; Arthur T. Fattibene

[57] ABSTRACT

A vacuum manifold having a rectangular opening with vacuum access bores connected into the rectangular opening for an illumination field to be projected there through. A vacuum manifold is placed between a photosensitive resist covered wafer and a lens element in a photolithographic tool. The relatively high illumination energy in an illumination field used for projecting an image of a reticle onto a photosensitive resist covered wafer often results in ablated, evaporated, and effused material being coated on the lens element. The vacuum manifold placed between the lens element and the photosensitive resist covered wafer creates an airflow for removing debris or contamination preventing coating of the lens surface. This prevents image quality from degradation over time, as well as reduces downtime needed for cleaning or maintenance of the photolithographic tool.

17 Claims, 3 Drawing Sheets

VACUUM ASSISTED DEBRIS REMOVAL SYSTEM

FIELD OF THE INVENTION

The present relates generally to photolithography as used in the manufacture of semiconductor devices, and more particularly to a debris removal system used for preventing possible contamination of the lens or other element that is closest to the photosensitive layer by any byproduct or emanation from said surface due either to residence time or the action of the actinic or alignment wavelengths on the surface, the byproduct causing contamination of the last element.

BACKGROUND OF THE INVENTION

In the manufacture of semiconductor devices, the image of a reticle is projected onto a photosensitive resist covered wafer. In order to obtain the high resolutions desired, it is necessary to bring a lens element or other element, that is part of the projection optics close to the surface of the photosensitive resist covered wafer. This distance may be as small as three mm. This, in combination with high energy illumination systems sometimes used to project the image of a reticle may result in ablated, evaporated, or effused material from the photosensitive resist covered wafer in the process of exposure and/or by background effusion with time of the material being inadvertently deposited on the lens element. This reduces system performance and is undesirable. Often, the lens element is difficult access and to clean, and results in undesirable downtime of the photolithographic tool or system. Additionally, the lens element may be damaged during cleaning. While vacuum debris removal or forced air systems have been used in very high laser cutters and ablating systems, they are not applicable in photolithographic systems where image quality must not be affected by the air flows involved. Accordingly, there is a need for a system to prevent the undesirable coating of a lens element with debris or contamination materials in a photolithographic system.

SUMMARY OF THE INVENTION

The present invention prevents coating of a lens element adjacent a photosensitive resist covered wafer. A vacuum manifold having an illumination field opening therein is placed between the last optical element of the projection optics and the photosensitive resist covered wafer. Bores within the vacuum manifold open to the illumination field opening. An upper gap is formed between the lens element and a top surface of the vacuum manifold. A bottom gap is formed between a bottom surface of the vacuum manifold and the photosensitive resist covered wafer. Clean gas or air is drawn in along the upper gap and down, away from the lens element, to the bores within the vacuum manifold around the perimeter of the illumination field opening. Clean gas or air is also drawn in along the bottom gap and out through the bores, preventing contamination from reaching the lens element. Some embodiments may not have a gap between the lens element and the manifold. The absence of the upper gap does not preclude the use and application of the invention. The airflow will be different but a common principle is claimed.

Accordingly, it is an object of the present invention to prevent possible coating of a lens element.

It is an advantage of the present invention that it does not effect image quality.

It is a feature of the present invention that a manifold vacuum system is placed between the lens element and the wafer.

These and other objects, advantages, and features will become readily apparent in view of the following detailed description.

DETAILED DESCRIPTION OF THE PREFERRED EMBODIMENTS

Figure 1:
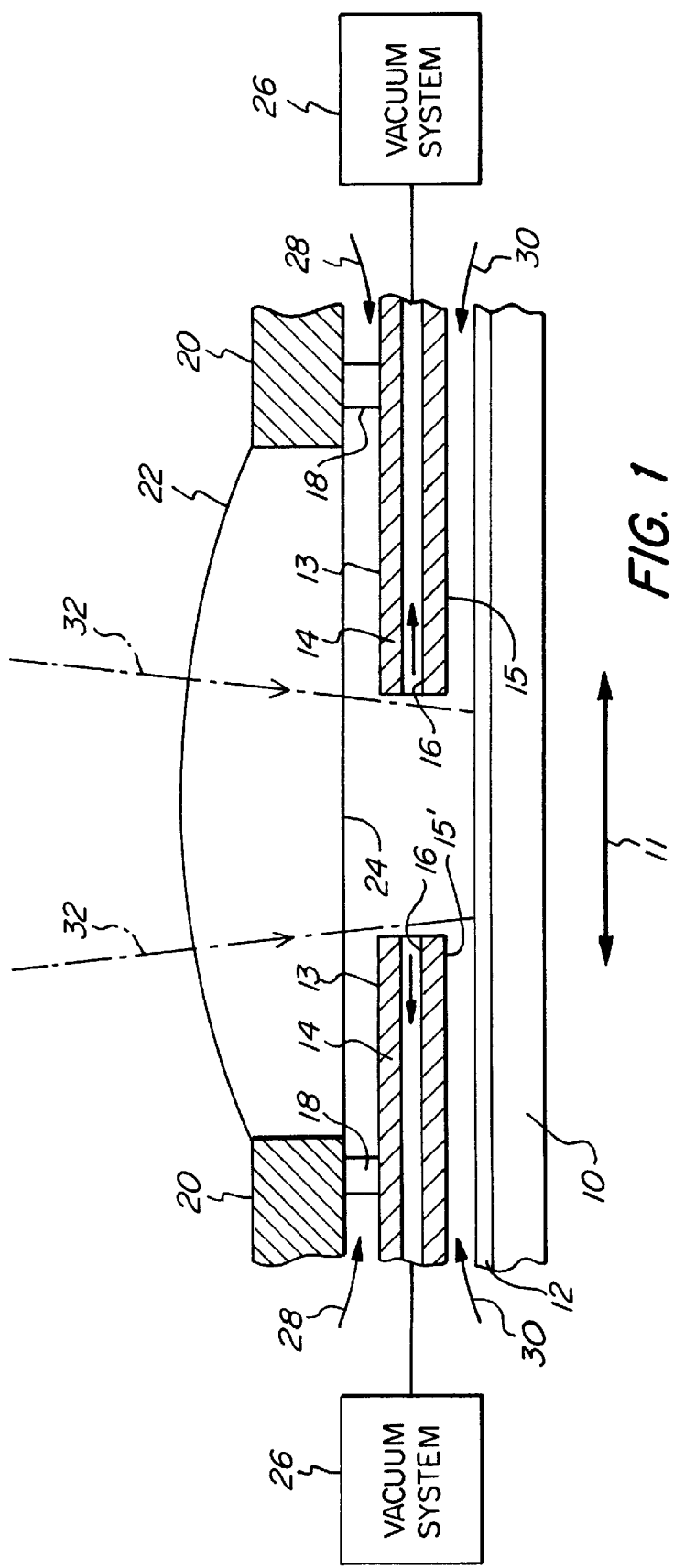
FIG. 1 is a schematic diagram, in partial cross section, illustrating the present invention.

FIG. 1 schematically illustrates a portion of the present invention. A wafer 10 has a photosensitive resist coating 12 thereon. Wafer 10 is moved or scanned in a direction indicated by arrow 11. Wafer 10 is generally placed on a stage, which is not shown. A substantially planar manifold 14 is placed adjacent the photosensitive resist coating 12. The manifold 14 has a plurality of side bores 16 therein. The manifold 14 is attached to a portion of the projection optics, for example lens mount 20, by manifold mounts 18. A lens element 22 is attached or held by lens mount 20. The lens element 22 has a lens surface 24. The manifold 14 has a top surface 13 adjacent lens surface 24, and a bottom surface 15 adjacent resist coating 12 on wafer 10. An upper gap is formed between the lens surface 24 and the top surface 13, and a lower gap is formed between the bottom surface 15 and the resist coating 12. A vacuum system 26 is coupled to or communicates with the side bores 16. Accordingly, the manifold 14 is placed between the wafer 10 having the photosensitive resist coating 12 thereon and the lens surface 24. The distance between the lens surface 24 and the photosensitive resist coating 12 on the wafer 10 may be as small as three mm. The photolithographic tool is generally placed in an environment having purged class I air. The image of the reticle is projected by the projection optics, including lens element 22, onto the photosensitive resist coating 12. Rays 32 represent the electromagnetic radiation forming an image as projected through a rectangular illumination opening in the manifold 14. The ends of the manifold 14 may be tapered or cut back to conform to the numerical aperture or cone of light or illumination from the projection optics, including lens element 22. Vacuum system 26 is coupled or connected to side bores 16. Accordingly, air is caused to flow down bores 16 to the vacuum system 26. Airflow, represented by arrows 28, is caused to flow through the upper gap along the lens surface 24 and downward through bores 16 adjacent the rectangular illumination field opening. Additionally, gas or air is caused to flow, represented by arrows 30, adjacent the photosensitive resist coating 12 through the lower gap and through the side bores 16 adjacent or open to the rectangular illumination field opening. This gas or airflow pattern pushes or directs potential contaminates from the photosensitive resist coating 12 away from the surface 24 of lens element 22, and picks up debris from the photosensitive resist coating 12 and carries it away preventing potential contamination of lens surface 24. The manifold 14 remains stationary with the projection optics as the wafer 10 is moved or scanned in the direction of arrow 11.

Figure 2:
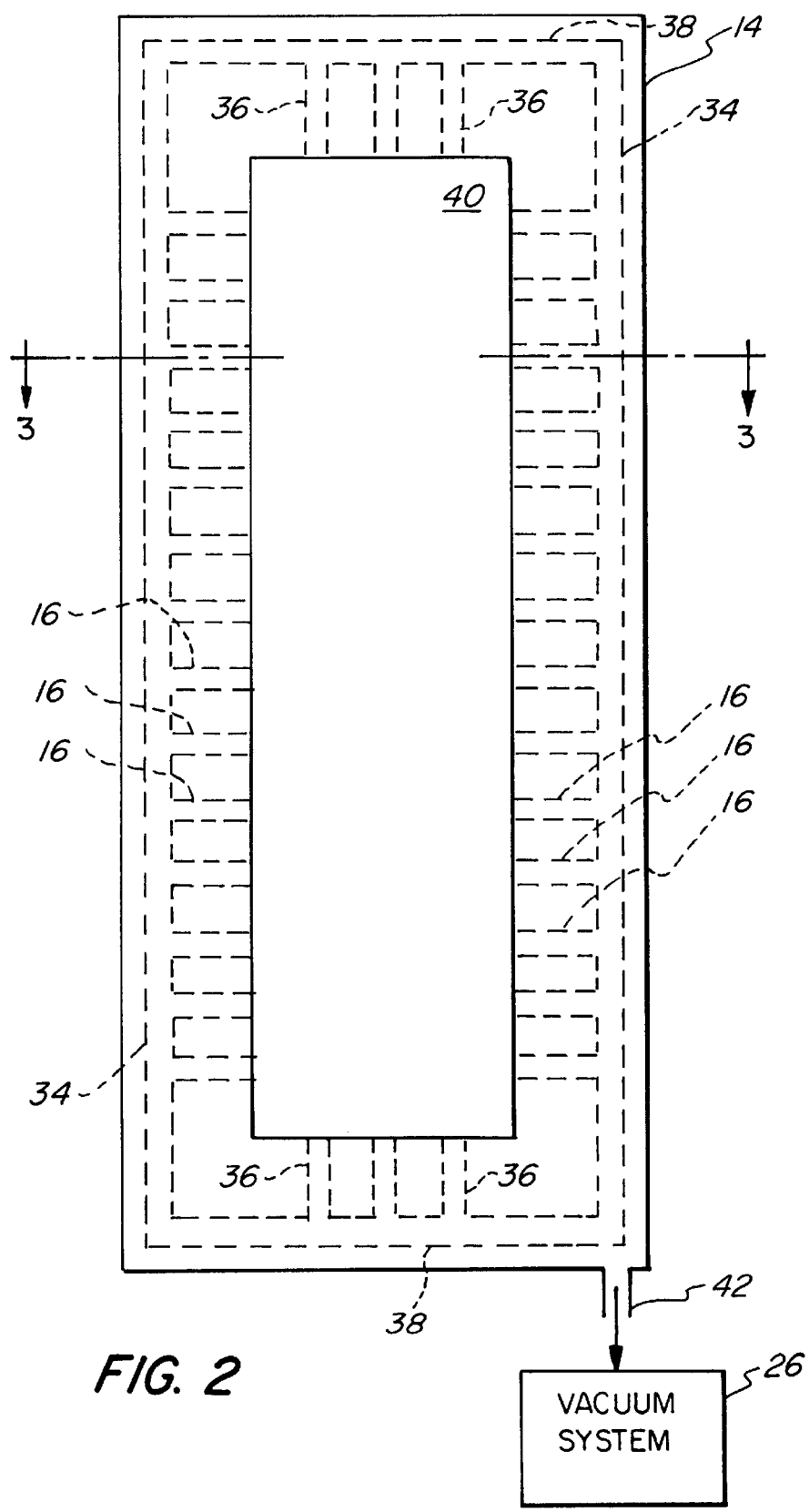
FIG. 2 is a plan view illustrating the present invention.

FIG. 2 is a plan view more clearly illustrating the vacuum manifold 14 illustrated in FIG. 1. A longitudinal passage 34 is coupled or connected to a plurality of side bores 16. This plurality is illustrated in principle: many configurations of hole or bore size and distribution may have equivalent functionality. The side bores 16 are open to the rectangular illumination field opening 40, which generally conforms to the rectangular illumination field used in the scanning photolithographic tool. The rectangular illumination field opening may be, for example, thirty millimeters long by eight millimeters wide. The longitudinal passages 34 are connected to lateral passages 38. End bores 36 are connected or coupled to lateral passages 38. The end bores 36 are opened to the rectangular illumination field opening 40. The longitudinal passages 38 and the lateral passages 34 are connected or coupled to a vacuum port 42. A vacuum system 26 is then connected to vacuum port 42. If desired, a second vacuum port, not shown, may be placed at the other end of the vacuum manifold 14 for the placement of a second vacuum system, not shown. Generally, it is only necessary to have side bores 16 opening along the opposing longitudinal sides of the illumination field opening 40 to provide sufficient gas or air flow to remove debris in most applications. End bores 36 in most applications will not be needed. The gas or air flow created by the vacuum manifold 14 need only be sufficient to remove debris, without adversely effecting image quality. Preferably, the side bores 16 and the end bores 36 are substantially equally spaced apart.

Figure 3:
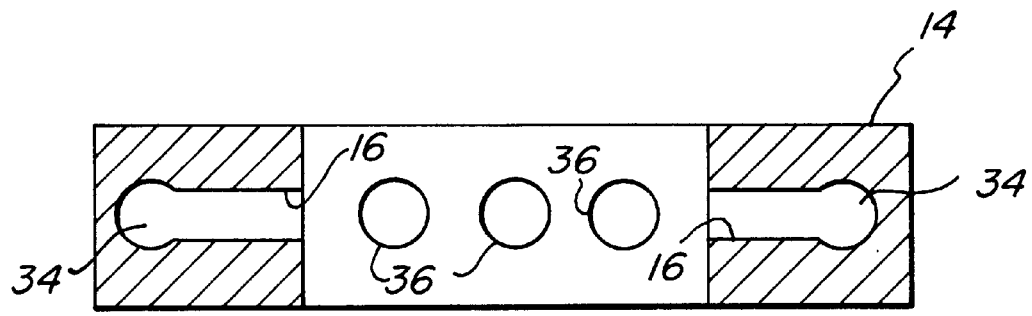
FIG. 3 is a cross section of line 3—3 in FIG. 2.

FIG. 3 is a cross section taken along line 3—3 in FIG. 2. FIG. 3 more clearly illustrates the side bores 16 being opened to the rectangular illumination field opening 40 and the longitudinal passages 34. The end bores 36 are illustrated as being circular, but may be of any cross sectional shape, including rectangular. The bores 16 and 36 may be rectangular openings made from a laminated structure.

Figure 4:
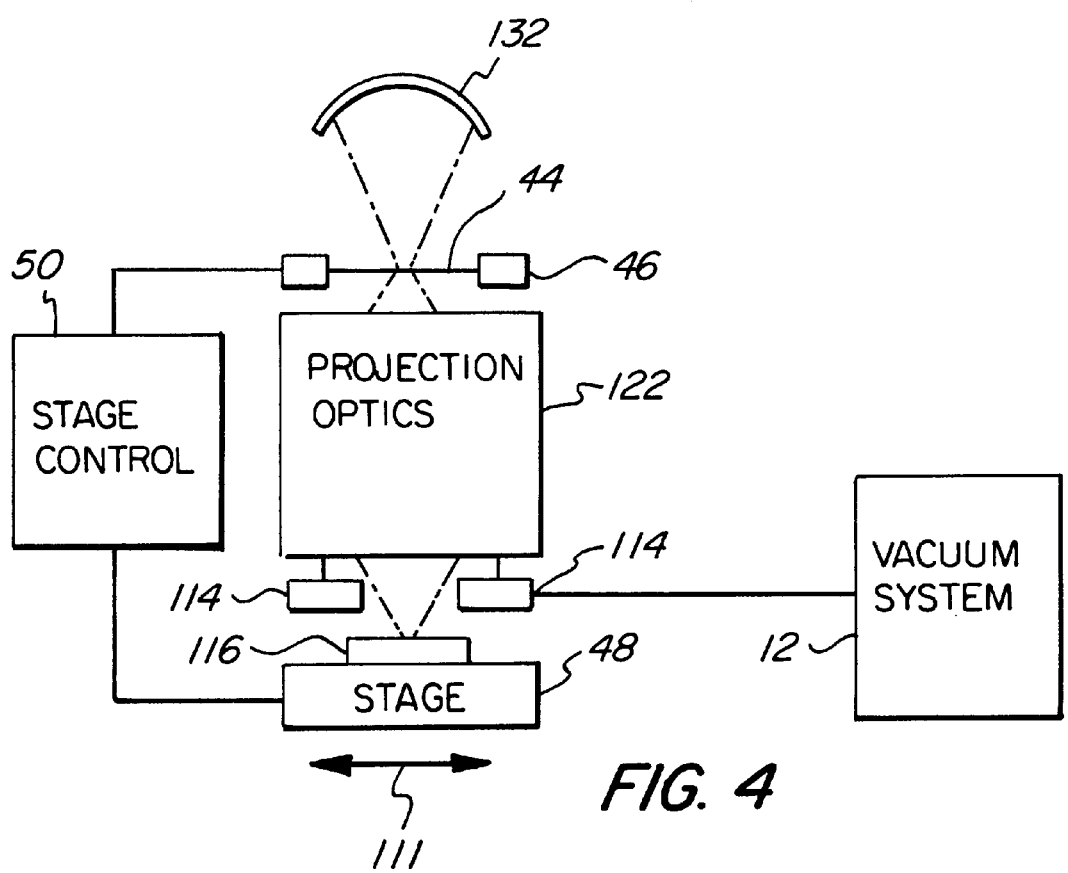
FIG. 4 is a schematic diagram of a photolithographic system using the present invention.

FIG. 4 is a schematic diagram illustrating the present invention in a photolithographic tool. An illumination source 132 provides illumination to a reticle 44, which is mounted on a reticle stage 46. The image of the reticle 44 is projected by projection optics 122 onto a photosensitive resist covered wafer 116. The wafer 116 is placed on a wafer stage 48. Stage control 50 controls the synchronous movement of the reticle stage 46 and the wafer stage 48 to move or scan the wafer 116 in a direction indicated by arrow 111. Typically, the projection optics will provide a reduction of four to one, resulting in the reticle stage moving at a different rate than the wafer stage. A vacuum manifold 114 is placed between the projection optics 122 and the wafer 116. The vacuum manifold 114 is attached to the projection optics 122, and is therefore fixed with respect to the projection optics 122. Vacuum system 126 is coupled to the vacuum manifold 114.

Accordingly, debris and contamination, for example created by the photosensitive resist coating on the wafer, is kept away from the surface of the lens element, preventing its coating or contamination. This increases system performance and prevents degradation of image quality over time. As a result throughput is increased because of less downtime and maintenance of the lithographic tool. The airflow created by the present invention should be sufficient to remove debris, but not so large so as to influence image quality.

While the present invention has been illustrated and described with respect to its preferred embodiments, it should be apparent to those skilled in the art that various modifications may be made without departing from the spirit and scope of the present invention.

What is claimed is:

1. A vacuum assisted debris removal system for use in photolithography comprising:

a manifold having a planar top surface and a planar bottom surface and an illumination field opening, said manifold placed between a lens element having a surface and a photosensitive resist covered substrate forming a first gap between the surface of the lens element and the planar top surface of said manifold and a second gap between the planar bottom surface of said manifold and a photosensitive resist covered substrate, said manifold having bores open and adjacent to the illumination field opening, said manifold positioned to establish a first flow pattern in the first gap across the surface of the lens element and towards the photosensitive resist covered substrate, and a second flow pattern in the second gap across the photosensitive resist covered substrate and towards the illumination field opening, and a vacuum source coupled to said manifold, whereby a flow pattern is obtained preventing the lens element from being coated with debris.

2. A vacuum assisted debris removal system as in claim 1, wherein:

said illumination field opening is rectangular having a pair of longitudinal sides and a pair of lateral sides.

3. A vacuum assisted debris removal system as in claim 2, wherein:

the bores are open along the pair of longitudinal sides.

4. A vacuum assisted debris removal system as in claim 3, wherein:

the bores are open along the pair of lateral sides.

5. A vacuum assisted debris removal system as in claim 1, further comprising:

a passage connecting the bores open to the illumination field together, said passage connected at one end to said vacuum source.

6. A vacuum assisted debris removal system as in claim 1, wherein:

the bores open to the illumination field opening are spaced substantially equally apart.

7. A vacuum assisted debris removal system for use in photolithography comprising:

a vacuum manifold having a top substantially planar surface and a bottom substantially planar surface, said vacuum manifold having a rectangular illumination field opening formed therein and a plurality of bores extending there through, the plurality of bores having a longitudinal axis substantially parallel to the top and bottom substantially planar surfaces, the plurality of bores having one end open to the rectangular illumination field and another end coupled to a vacuum port, said vacuum manifold mounted so as to be fixed with respect to projection optics adjacent a lens element, and forming a first gap between the top substantially planar surface and the lens element and a second gap between the bottom substantially planar surface and a substrate, so that a first flow pattern is formed in the first gap across the surface of the lens element and towards the illumination field opening and in the direction of the substrate, and a second flow pattern is formed in the second gap across the substrate and towards the illumination field opening, whereby debris and contamination is carried away from the lens element preventing the lens element from being coated.

8. A vacuum assisted debris removal system for use in photolithography as in claim 7 wherein:

the rectangular illumination field has a pair of longitudinal edges and a pair of lateral edges, the plurality of bores being open along the pair of longitudinal edges.

9. A vacuum assisted debris removal system for use in photolithography as in claim 7 wherein:
    said plurality of bores having one end open to the rectangular illumination field are spaced substantially equally apart.

10. A vacuum assisted debris removal system for use in photolithography comprising:
    an illumination source having an illumination field;
    a reticle placed adjacent said illumination source;
    projection optics positioned to project an image of said reticle and having a lens element;
    a wafer stage positioned to receive at least a portion of the image of said reticle;
    a planar vacuum manifold placed between the lens element and said wafer stage forming a first gap between a top surface of said planar vacuum manifold and a surface of the lens element and a second gap between a bottom surface of said planar vacuum manifold and said wafer stage and fixed relative to said projection optics, said vacuum manifold having a plurality of bores and an illumination field opening therein sized to accommodate the illumination field, the illumination field opening having a periphery, the plurality of bores opening on the periphery of the illumination field opening; and
    a vacuum system coupled to the plurality of bores of said vacuum manifold,
    whereby airflow is created by said vacuum system in the first gap between the lens element and the top surface of said planar vacuum manifold and is directed downward at the illumination field opening away from the lens element preventing the lens element from becoming coated with debris, and airflow is created in the second gap between the bottom surface of said vacuum manifold and the wafer stage and is directed upward at the illumination field opening.

11. A vacuum assisted debris removal system for use in photolithography as in claim 10 wherein:
    the illumination field is rectangular having a pair of longitudinal sides and a pair of lateral sides.

12. A vacuum assisted debris removal system for use in photolithography as in claim 11 wherein:
    the plurality of bores are open along the pair of longitudinal sides.

13. A vacuum assisted debris removal system for use in photolithography as in claim 10 wherein:
    the plurality of bores are substantially equally spaced apart along the periphery of said illumination field.

14. A vacuum assisted debris removal system for use in photolithography comprising:
    a manifold having an illumination field opening placed between a lens element having a surface and a photosensitive resist covered substrate, said manifold having bores open to the illumination field opening and positioned to establish a flow pattern across the surface of the lens element and downward towards the photosensitive resist covered substrate; and
    a vacuum source coupled to said manifold,
    whereby a flow pattern is obtained preventing the lens element from being coated with debris.

15. A vacuum assisted debris removal system for use in photolithography comprising:
    an illumination source having an illumination field;
    a reticle placed adjacent said illumination source;
    projection optics positioned to project an image of said reticle and having a lens element;
    a wafer stage positioned to receive at least a portion of the image of said reticle;
    a vacuum manifold placed between the lens element and said wafer stage forming a gap between a top surface of said vacuum manifold and a surface of the lens element and fixed relative to said projection optics, said vacuum manifold having a plurality of bores and an illumination field opening therein sized to accommodate the illumination field, the illumination field opening having a periphery, the plurality of bores opening on the periphery of the illumination field opening; and
    a vacuum system coupled to the plurality of bores of said vacuum manifold,
    whereby airflow is created by said vacuum system in the gap between the lens element and the top surface of said vacuum manifold and is directed downward at the illumination field opening away from the lens element preventing the lens element from becoming coated with debris.

16. A vacuum assisted debris removal system for use in photolithography comprising:
    projection optics having a lens element with a surface;
    a planar manifold having an illumination field opening therein and a top surface positioned adjacent said projection optics forming an upper gap between the surface of said lens element and the top surface of said planar manifold, said planar manifold having a plurality of side bores therein opening to said illumination field opening; and
    a vacuum system coupled to the plurality of side bores in said planar manifold, said vacuum system forming a gas flow pattern in the upper gap between the surface of the lens element and the top surface of said planar manifold in a direction towards the illumination field opening and down away from the surface of the lens element of said projection optics.

17. A method of preventing coating of an element of projection optics used in photolithography comprising:
    placing a manifold having an illumination field opening and a top surface between the element and a substrate; and
    forming a gas flow between the element and the top surface of the manifold towards the illumination field opening, then down away from the element into the illumination field opening, towards the substrate and through the manifold to a vacuum source,
    whereby any possible contaminants are directed away from the element of the projection optics preventing the element from becoming coated with debris.

* * * * *